(12) United States Patent
Nishiguchi et al.

(10) Patent No.: US 8,912,550 B2
(45) Date of Patent: Dec. 16, 2014

(54) DISLOCATIONS IN SIC SEMICONDUCTOR SUBSTRATE

(71) Applicant: Sumitomo Electric Industries, Ltd., Osaka-Shi, Osaka (JP)

(72) Inventors: Taro Nishiguchi, Itami (JP); Shin Harada, Osaka (JP); Shinsuke Fujiwara, Itami (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 0 days.

(21) Appl. No.: 13/664,636

(22) Filed: Oct. 31, 2012

(65) Prior Publication Data

US 2013/0161646 A1 Jun. 27, 2013

Related U.S. Application Data

(60) Provisional application No. 61/579,184, filed on Dec. 22, 2011, provisional application No. 61/579,174, filed on Dec. 22, 2011, provisional application No. 61/579,195, filed on Dec. 22, 2011.

(30) Foreign Application Priority Data

| Dec. 22, 2011 | (JP) | 2011-280863 |
| Dec. 22, 2011 | (JP) | 2011-280864 |
| Dec. 22, 2011 | (JP) | 2011-280865 |

(51) Int. Cl.
*H01L 29/15* (2006.01)
*H01L 31/0312* (2006.01)

(52) U.S. Cl.
USPC .......................................... 257/77

(58) Field of Classification Search
None
See application file for complete search history.

(56) References Cited

U.S. PATENT DOCUMENTS

| 5,915,194 | A  | * | 6/1999  | Powell et al. ............... 438/478 |
| 7,314,520 | B2 |   | 1/2008  | Powell et al. |
| 2003/0070611 | A1 | * | 4/2003  | Nakamura et al. ........... 117/109 |
| 2011/0006309 | A1 | * | 1/2011  | Momose et al. .............. 257/77 |
| 2011/0300323 | A1 | * | 12/2011 | Straubinger et al. ......... 428/64.1 |

* cited by examiner

*Primary Examiner* — Steven Loke
*Assistant Examiner* — Juanita B Rhodes
(74) *Attorney, Agent, or Firm* — Drinker Biddle & Reath LLP

(57) ABSTRACT

A semiconductor substrate has a main surface and formed of single crystal silicon carbide. The main surface includes a central area, which is an area other than the area within 5 mm from the outer circumference. When the central area is divided into square areas of 1 mm×1 mm, in any square area, density of dislocations of which Burgers vector is parallel to <0001> direction is at most $1 \times 10^5$ cm$^{-2}$. Thus, a silicon carbide semiconductor substrate enabling improved yield of semiconductor devices can be provided.

14 Claims, 5 Drawing Sheets

US 8,912,550 B2

DISLOCATIONS IN SIC SEMICONDUCTOR SUBSTRATE

This application claims the benefit of U.S. Provisional Application No. 61/579,184 filed Dec. 22, 2011, U.S. Provisional Application No. 61/579,174 filed Dec. 22, 2011 and U.S. Provisional Application No. 61/579,195 filed Dec. 22, 2011, each of which are incorporated by reference herein in their entireties.

BACKGROUND OF THE INVENTION

1. Field of the Invention

The present invention relates to a semiconductor substrate and, more specifically, to a semiconductor substrate formed of a single-crystal silicon carbide.

2. Description of the Background Art

Recently, a silicon carbide substrate has come to be used for manufacturing semiconductor devices. As compared with more commonly used material such as silicon, silicon carbide has wider bandgap. Therefore, a semiconductor device using a silicon carbide substrate has advantages such as high breakdown voltage and low on-resistance and, in addition, its property does not much degrade in high-temperature environment.

In order to realize a semiconductor device having superior characteristics as mentioned above, use of a silicon carbide semiconductor with reduced density of crystal defects has been proposed. By way of example, U.S. Pat. No. 7,314,520 discloses a silicon carbide substrate of which screw dislocation density is reduced to 2500 $cm^{-2}$ or lower.

Even when only the defects disclosed in the prior art are reduced, however, it has been difficult to improve yield of semiconductor devices formed on the silicon carbide substrate.

SUMMARY OF THE INVENTION

The present invention was made to solve the above-described problem, and its object is to provide a silicon carbide semiconductor substrate enabling higher yield of semiconductor devices.

Through intensive study, the inventors have found that in order to improve yield of silicon carbide semiconductor devices, it is important not to focus on average dislocation density of a silicon carbide semiconductor substrate but to focus on local dislocation density, and to reduce dislocation density in all areas used for manufacturing the semiconductor devices.

According to an aspect, the present invention provides a semiconductor substrate having a main surface, formed of single crystal silicon carbide. The main surface comprises an outer circumferential area within 5 mm from an outer circumference and a central area other than the outer circumferential area. When the central area is divided into square areas of 1 mm×1 mm, in any square area, density of dislocations of which Burgers vector is parallel to <0001> direction is at most $1 \times 10^5$ $cm^{-2}$.

Thus, the yield of semiconductor devices manufactured using the above-described semiconductor substrate can be improved.

In the semiconductor substrate described above, preferably, in the central area, density of dislocations of which Burgers vector is parallel to the <0001> direction is lower than density of dislocations of which Burgers vector includes components in the <0001> direction and <11-20> direction.

Thus, the yield of semiconductor devices manufactured using the above-described semiconductor substrate can further be improved.

The semiconductor substrate described above may include a dislocation branched to a plurality of dislocation lines inside the semiconductor substrate and of which Burgers vector is parallel to the <0001> direction.

Preferably, diameter of the semiconductor substrate is at least 4 inches. Consequently, a semiconductor substrate of large diameter can be obtained and, hence, semiconductor devices can be manufactured with high efficiency.

In the semiconductor device described above, preferably, the single crystal silicon carbide forming the semiconductor substrate has polytype of 4H.

A semiconductor device using a silicon carbide substrate having polytype of 4H has high mobility and, therefore, it can suitably be used for a power device.

According to another aspect, the present invention provides a semiconductor substrate having a main surface, formed of single crystal silicon carbide. The main surface comprises an outer circumferential area within 5 mm from an outer circumference and a central area other than the outer circumferential area. When the central area is divided into square areas of 1 mm×1 mm, in any square area, density of dislocations of which Burgers vector is parallel to <11-20> direction, with dislocation line existing in the basal plane and the dislocation line exposed at the main surface of the semiconductor substrate, is at most $1 \times 10^5$ $cm^{-2}$.

Thus, the yield of semiconductor devices manufactured using the above-described semiconductor substrate can be improved.

In the semiconductor substrate described above, preferably, density of dislocations of which Burgers vector is parallel to the <11-20> direction is at most $1 \times 10^5$ $cm^{-2}$.

Thus, the yield of semiconductor devices manufactured using the above-described semiconductor substrate can further be improved.

In the semiconductor substrate described above, preferably, density of dislocations of which Burgers vector is parallel to the <11-20> direction is lower than density of dislocations of which Burgers vector includes components in the <0001> direction and the <11-20> direction.

The semiconductor substrate described above may include a dislocation branched to a plurality of dislocation lines inside the semiconductor substrate and having Burgers vector parallel to the <11-20> direction.

Preferably, diameter of the semiconductor substrate is at least 4 inches.

Consequently, a semiconductor substrate of large diameter can be obtained and, hence, semiconductor devices can be manufactured with high efficiency.

In the semiconductor substrate described above, preferably, the single crystal silicon carbide forming the semiconductor substrate has polytype of 4H.

A semiconductor device using a silicon carbide substrate having polytype of 4H has high mobility and, therefore, it can suitably be used for a power device.

According to a further aspect, the present invention provides a semiconductor substrate having a main surface, formed of single crystal silicon carbide. The main surface comprises an outer circumferential area within 5 mm from an outer circumference and a central area other than the outer circumferential area. When the central area is divided into square areas of 1 mm×1 mm, in any square area, density of dislocations of which Burgers vector includes components parallel to <0001> direction and <11-20> direction is at most $1 \times 10^5$ $cm^{-2}$.

Thus, the yield of semiconductor devices manufactured using the above-described semiconductor substrate can be improved.

In the semiconductor substrate described above, preferably, in the central area, density of dislocations of which Burgers vector is parallel to the <0001> direction is lower than density of dislocations of which Burgers vector includes components in the <0001> direction and the <11-20> direction.

Thus, the yield of semiconductor devices manufactured using the above-described semiconductor substrate can further be improved.

In the semiconductor substrate described above, preferably, in the central area, density of dislocations of which Burgers vector is parallel to the <11-20> direction is lower than density of dislocations of which Burgers vector includes components in the <0001> direction and the <11-20> direction.

Thus, the yield of semiconductor devices manufactured using the above-described semiconductor substrate can further be improved.

The semiconductor substrate described above may include a dislocation branched to a plurality of dislocation lines inside the semiconductor substrate and having Burgers vector including components in the <0001> direction and the <11-20> direction.

Preferably, diameter of the semiconductor substrate is at least 4 inches. Consequently, a semiconductor substrate of large diameter can be obtained and, hence, semiconductor devices can be manufactured with high efficiency.

In the semiconductor substrate described above, preferably, the single crystal silicon carbide forming the semiconductor substrate has polytype of 4H.

A semiconductor device using a silicon carbide substrate having polytype of 4H has high mobility and, therefore, it can suitably be used for a power device.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
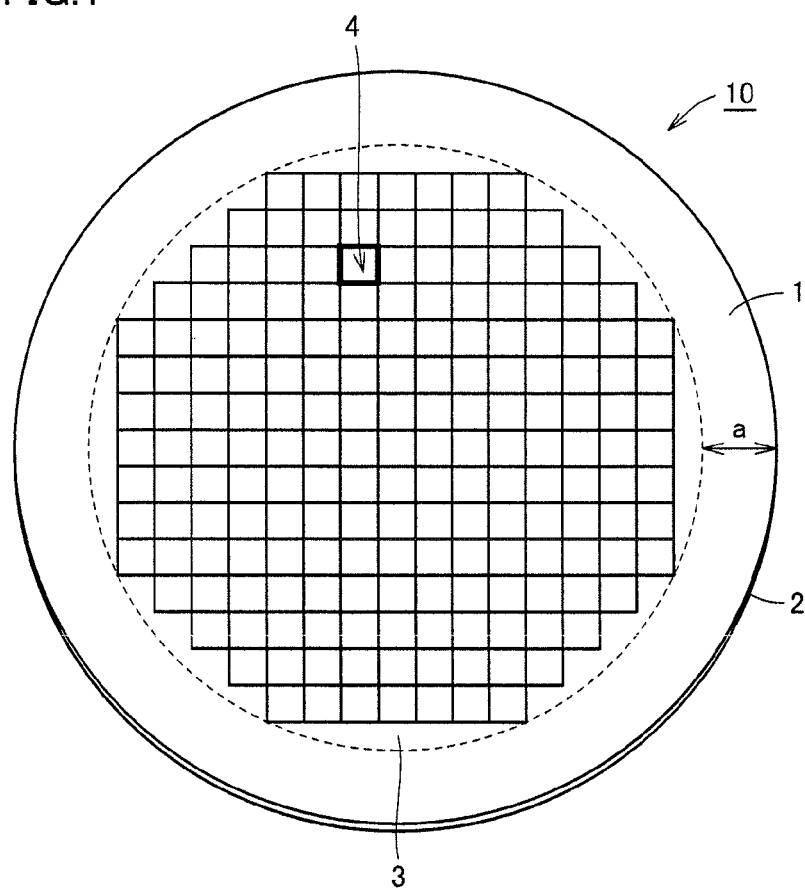
FIG. 1 is a plan view schematically showing a semiconductor substrate in accordance with Embodiment 1 of the present invention.

In the following, embodiments of the present invention will be described with reference to the figures. In the figures, the same or corresponding portions are denoted by the same reference characters and description thereof will not be repeated.

In the description related to crystallography in the specification, individual orientation will be denoted by [ ], group orientation by < >, individual plane by ( ), and group plane by { }, respectively. Though it is a common practice in crystallography to put an over bar "-" over a numeral to represent a negative index, in the present specification, a negative sign is put in front of a numeral. Further, a system having full azimuth of 360° is used to indicate an angle.

Embodiment 1

Referring to FIG. 1, a semiconductor substrate 10 in accordance with the present embodiment is formed of a single crystal silicon carbide, and it mainly has a main surface 1 and a central area 3. The single crystal silicon carbide has a hexagonal crystal structure. The single crystal silicon carbide forming semiconductor substrate 10 preferably has the polytype of 4H. The normal of main surface 1 is tilted by an off angle θ, for example, from the <0001> direction. As a specific example, main surface 1 is preferably the (0001) plane off by 4° to the <11-20> direction. Further, the diameter of semiconductor substrate 10 is, preferably, 4 inches or larger.

Central area 3 is an area except for an outer circumferential area 1 of 5 mm (the distance indicated by "a" in FIG. 1) from the outer circumference 2 of semiconductor substrate 10 to the center of the semiconductor substrate. Let as assume that central area 3 is divided into a number of square areas 4, each side of which is 1 mm, as shown in FIG. 1.

Figure 2:
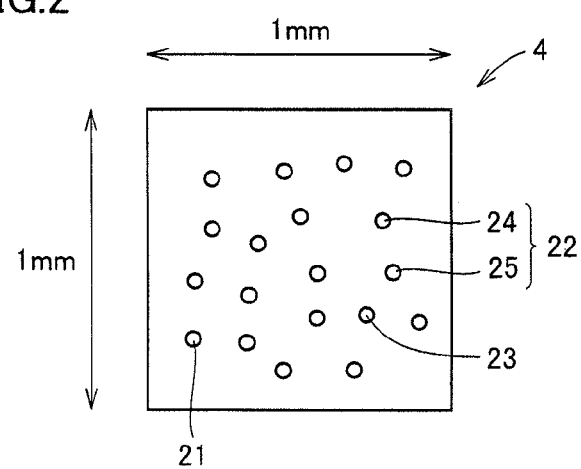
FIG. 2 is a plan view schematically showing a part of the semiconductor substrate in accordance with Embodiment 1 of the present invention.

FIG. 2 shows square area 4 of semiconductor substrate 10 in enlargement. Referring to FIG. 2, square area 4 generally involves various types of dislocations. By way of example, square area 4 has a dislocation 21 of which Burgers vector is parallel to the <0001> direction.

Further, square area 4 may have a dislocation 22 of which Burgers vector is parallel to the <11-20> direction. The dislocation 22 may include a dislocation 24 of which Burgers vector is parallel to the <11-20> direction and which has a dislocation line in the basal plane, with the dislocation line exposed to the main surface of the semiconductor substrate, and other dislocation 25. Here, the basal plane means the (0001) plane (in other words, the plane having the c-axis as the normal). Further, square area 4 may have a dislocation 23 of which Burgers vector includes components in the <11-20> direction and the <0001> direction.

Preferably, the density of dislocations 21 of which Burgers vector is parallel to the <0001> direction in semiconductor substrate 10 is at most $1 \times 10^5$ cm$^{-2}$, preferably at most $1 \times 10^4$ cm$^{-2}$, and more preferably at most $1 \times 10^3$ cm$^{-2}$, in any square area 4.

The density of dislocations 24 of which Burgers vector is parallel to the <11-20> direction and which have dislocation line in the basal plane, with the dislocation line exposed to the main surface 1 of semiconductor substrate 10, in semiconductor substrate 10 may be at most $1 \times 10^5$ cm$^{-2}$, in any square area 4. Preferably, the density of dislocations 24 of which Burgers vector is parallel to the <11-20> direction and which have dislocation line in the basal plane, with the dislocation line exposed to the main surface 1 of semiconductor substrate 10, is at most $1 \times 10^4$ cm$^{-2}$, and more preferably at most $1 \times 10^3$ cm$^{-2}$, in any square area 4.

Preferably, the density of dislocations 23 of which Burgers vector includes components in the <11-20> direction and the <0001> direction is at most $1 \times 10^5$ cm$^{-2}$, in any square area 4. More preferably, the density of dislocations 23 of which Burgers vector includes components in the <11-20> direction and the <0001> direction is at most $1 \times 10^4$ cm$^{-2}$, and more preferably at most $1 \times 10^3$ cm$^{-2}$, in any square area 4.

Preferably, the density of dislocations 22 of which Burgers vector is parallel to the <11-20> direction is at most $1 \times 10^5$ cm$^{-2}$, more preferably at most $1 \times 10^4$ cm$^{-2}$, and further preferably at most $1 \times 10^3$ cm$^{-2}$, in any square area 4.

Further, preferably, in the central area 3, the density of dislocations 21 of which Burgers vector is parallel to the <0001> direction is lower than the density of dislocations 23 of which Burgers vector includes components in the <0001> direction and the <11-20> direction. More preferably, the density of dislocations 21 of which Burgers vector is parallel to the <0001> direction is lower than the density of dislocations 23 of which Burgers vector includes components in the <0001> direction and the <11-20> direction, in any square area 4.

Further, in the central area 3, the density of dislocations 22 of which Burgers vector is parallel to the <11-20> direction is lower than the density of dislocations 23 of which Burgers vector includes components in the <0001> direction and the <11-20> direction. More preferably, the density of dislocations 22 of which Burgers vector is parallel to the <11-20> direction is lower than the density of dislocations 23 of which Burgers vector includes components in the <0001> direction and the <11-20> direction, in any square area 4.

Here, the method of measuring the dislocation density will be described.

The dislocation density is calculated, after the surface of semiconductor substrate 10 is subjected to etching, by counting the number of etch pits on the surface of semiconductor substrate 10 using, for example, a Nomarski differential-interference microscope. The etching process is done, for example, by dipping semiconductor substrate 10 in a KOH (potassium hydroxide) solution of 500° C. for 10 minutes. Alternatively, etching may be performed by gas-etching the surface of semiconductor substrate 10 with a mixed gas of chlorine and oxygen at 1000° C. for an hour.

Next, the terms used above will be described with reference to FIGS. 3 and 4.

Figure 3:
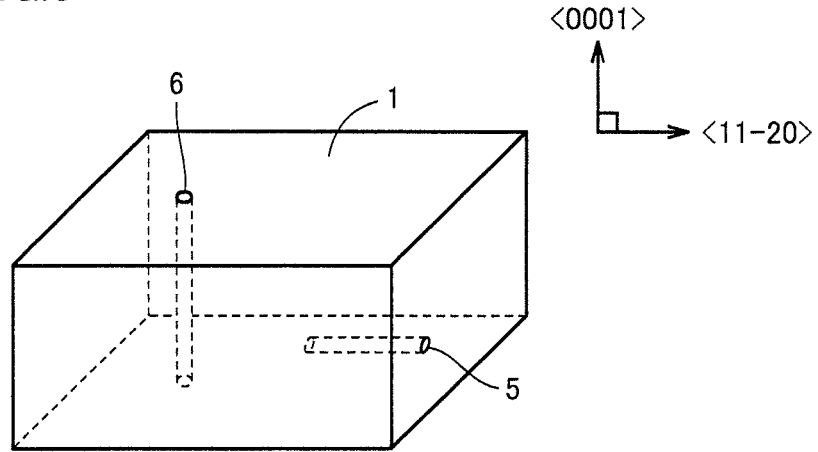
FIG. 3 schematically illustrates basal plane dislocation and threading dislocation when off angle is 0.

FIG. 3 shows dislocations generated in semiconductor substrate 10 formed of single crystal silicon carbide with the off angle of 0. Dislocations can mainly be classified to threading dislocation 6 and basal plane dislocation 5. Threading dislocation 6 refers to a dislocation that extends from one main surface 1 to the other main surface 1 of semiconductor substrate 10. In FIG. 3, it extends in the <0001> direction, from one main surface 1 to the other main surface 1 of semiconductor substrate 10. If the off angle is 0, the dislocation line of threading dislocation 6 extends in the <0001> direction. The basal plane dislocation 5 refers to a dislocation of which dislocation line exists in the basal plane of crystal. The dislocation line of basal plane dislocation 5 extends parallel to the basal plane.

Figure 4:
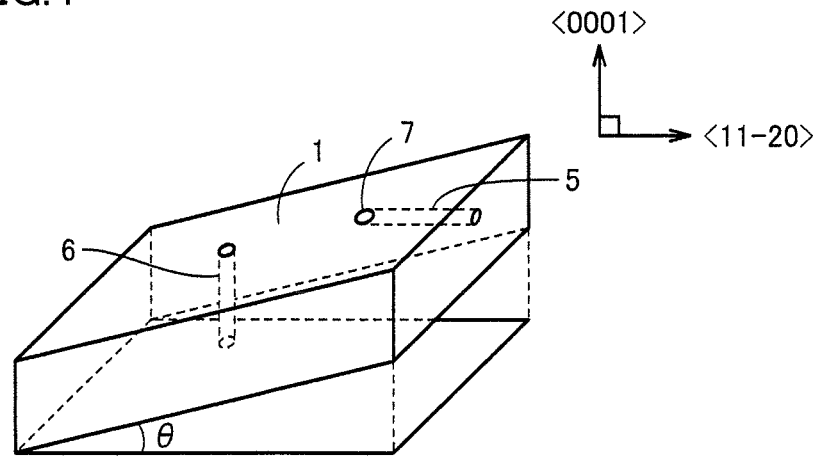
FIG. 4 schematically illustrates basal plane dislocation and threading dislocation when off angle is θ.

FIG. 4 shows dislocations generated in semiconductor substrate 10 formed of single crystal silicon carbide with the off angle of θ. As described above, the dislocation line of basal plane dislocation 5 extends parallel to the basal plane (c plane). Therefore, if the off angel of single crystal silicon carbide forming semiconductor substrate 10 has a finite value θ, it is possible that basal plane dislocation 5 is exposed on main surface 1. If the dislocation line of basal plane dislocation 5 extends in the <11-20> direction, it is possible that basal plane dislocation 5 is exposed on a side surface of semiconductor substrate 10. A dislocation 7 represents an example of dislocation that has the dislocation line in the basal plane and the dislocation line is exposed on the main surface of semiconductor substrate 10.

Figure 5:
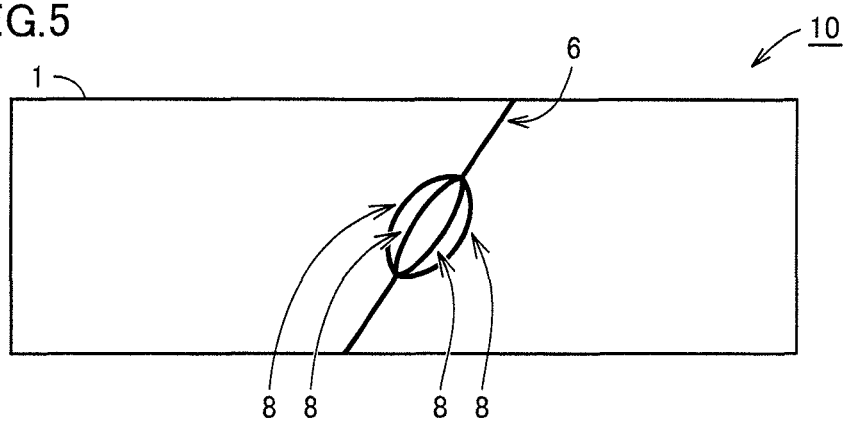
FIG. 5 is a cross-sectional view schematically showing the semiconductor substrate in accordance with Embodiment 1 of the present invention.

Referring to FIG. 5, semiconductor substrate 10 may have a dislocation that branches to a plurality of dislocation lines 8 in semiconductor substrate 10, with the Burgers vector being parallel to the <0001> direction. By way of example, if the polytype of silicon carbide forming semiconductor substrate 10 is 4H, a dislocation of which Burgers vector is 1 c (where 1 c=<0001>, same in the following) is branched to four dislocation lines 8 of which Burgers vector is 0.25 c, inside semiconductor substrate 10. Further, the four dislocation lines 8 may merge inside semiconductor substrate 10 to be a dislocation of which Burgers vector is 1 c.

Further, semiconductor substrate 10 may have a dislocation branched to a plurality of dislocation lines 8 inside semiconductor substrate 10, and having the Burgers vector parallel to the <11-20> direction. By way of example, if the polytype of silicon carbide forming semiconductor substrate 10 is 4H, a dislocation of which Burgers vector is ⅓<11-20> is branched to two dislocation lines 8 of which Burgers vector is ⅓<10-10> and ⅓<01-10> inside semiconductor substrate 10. Further, the two dislocation lines 8 mentioned above may be merged to a dislocation of which Burgers vector is ⅓<11-20> inside semiconductor substrate 10.

Further, semiconductor substrate 10 may have a dislocation branched to a plurality of dislocation lines 8 inside semiconductor substrate 10, and having the Burgers vector including components in the <0001> direction and the <11-20> direction. Further, the branched dislocation lines 8 may be merged to a dislocation of which Burgers vector is 1 c+⅓<11-20> inside semiconductor substrate 10.

Next, a method of manufacturing semiconductor substrate 10 in accordance with the present embodiment will be described.

Figure 6:
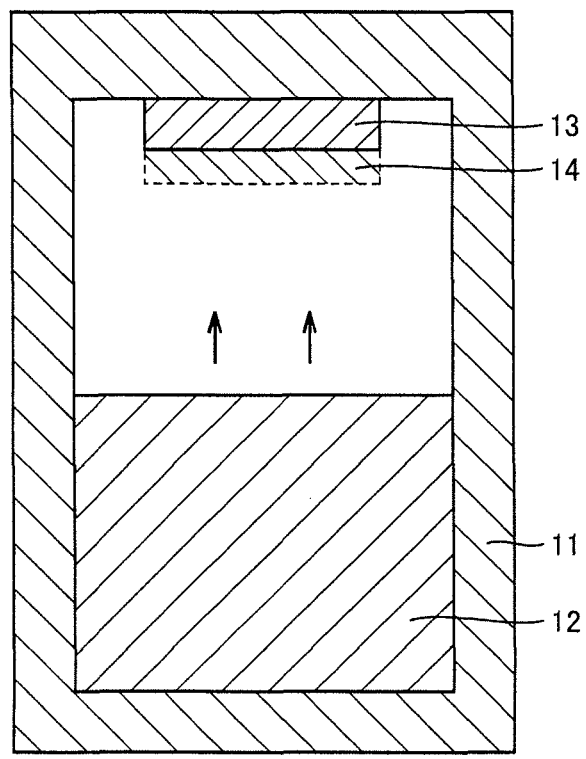
FIG. 6 is an illustration schematically showing an apparatus for manufacturing the semiconductor substrate in accordance with Embodiment 1 of the present invention.

Referring to FIG. 6, an apparatus for manufacturing semiconductor substrate 10 mainly has a crucible 11 and a heating unit (not shown). Source material 12 is contained in crucible 11. Source material 12 is row material for growing a silicon carbide crystal 14, and it is not specifically limited, provided that row material gas such as SiC$_2$ gas or Si$_2$C gas is generated. Considering easiness of handling and readiness to prepare the row material, use of silicon carbide powder as source material 12 is preferred. The silicon carbide power may be obtained by, for example, pulverizing silicon carbide polycrystal. The heating unit is arranged to cover the outside of crucible 11, for heating source material 12. By way of example, a high frequency heating coil is used as the heating unit.

A seed crystal 13 is placed in crucible 11. On seed crystal 13, silicon carbide crystal 14 grows by sublimation of source material 12. Seed crystal 13 is a crystal of silicon carbide, preferably having hexagonal crystal structure. For a hexagonal crystal, plane orientation of the surface of seed crystal may be {0001} plane or {03-38} plane. Further, it is preferred that such a crystal surface has an off angle. As a specific example, it is preferred that the (0001) plane is tilted by at most 10° to the <11-20> direction. Preferably, the off angle is at least 2° and at most 8°, and more preferably, at least 4° and at most 6°.

Further, it is preferred that the surface of seed crystal 13 is subjected to CMP (Chemical Mechanical Polishing). Preferably, surface roughness of seed crystal 13 is smaller than 1 nm in root-mean square (RMS) roughness.

As indicated by the arrows in FIG. 6, by sublimation of source material 12 and re-crystallization on seed crystal 13, a silicon carbide crystal 14 grows on seed crystal 13. The temperature for sublimation and re-crystallization of silicon carbide is, for example, at least 2100° C. and at most 2500° C. A temperature gradient is set such that the temperature lowers from the side of source material 12 to the side of seed crystal 13.

The inside of crucible 11 is filled with a mixed gas of argon and nitrogen. When the temperature of atmosphere in crucible 11 attains to a prescribed temperature of at least 2000° C. and at most 2500° C. and the pressure of atmosphere in crucible 11 attains to a prescribed pressure of at most 5 kPa, realizing an environment in which raw material gas generates from source material 12 because of sublimation of silicon carbide powder, vapor phase growth of silicon carbide crystal 14 by sublimation starts. The growth rate of silicon carbide at this time is preferably slower than 0.01 mm per hour. Growth pressure of silicon carbide crystal during the growth is, for example, about 4 kPa (30 Torr).

Seed crystal 13 is provided with an off angle of, for example, 4°. If there is any dislocation on the surface of seed crystal 13, the dislocation is inherited by silicon carbide crystal 14 formed thereon. Therefore, silicon carbide crystal 14 is grown on the surface of seed crystal 13 in a step flow growth mode, which does not cause two-dimensional nucleation. In this manner, it becomes possible to let go part of the dislocations exposed on the surface of seed crystal 13 to the lateral direction in the figure, so that the part of dislocations does not extend to the main surface. Further, generation of new dislocations during growth of silicon carbide crystal 14 can be prevented.

After silicon carbide crystal 14 is grown to a prescribed thickness through the process described above, silicon carbide crystal 14 is sliced, and thereby semiconductor substrate 10 of silicon carbide is completed.

Next, functions and effects of semiconductor substrate 10 in accordance with the present embodiment will be described.

Semiconductor substrate 10 in accordance with the present embodiment is fabricated by slicing silicon carbide crystal 14, which was formed with the dislocations on the surface of seed crystal 13 released in the lateral direction and generation of new dislocations during growth of silicon carbide crystal 14 suppressed, as described above. As a result, in any square area 4 obtained by dividing central area 3 to square areas 4 of 1 mm×1 mm, the density of dislocations of which Burgers vector is parallel to the <0001> direction is at most $1 \times 10^5$ cm$^{-2}$.

Thus, yield of semiconductor devices manufactured by using the above-described semiconductor substrate 10 can be improved.

If the density of dislocations of which Burgers vector is parallel to the <0001> direction is lower than the density of dislocations of which Burgers vector includes components in the <0001> direction and the <11-20> direction, yield of the semiconductor devices manufactured by using the above-described semiconductor substrate 10 can further be improved.

Further, if the diameter of semiconductor substrate 10 is 4 inches or larger, a large semiconductor substrate is obtained and hence, semiconductor devices can be manufactured efficiently.

Further, if single crystal silicon carbide forming semiconductor substrate 10 has the polytype of 4H, a semiconductor device using a silicon carbide substrate having polytype of 4H has high mobility and, therefore, it can suitably be used for a power device.

Semiconductor substrate 10 in accordance with the present embodiment is fabricated by slicing silicon carbide crystal 14, which was formed with the dislocations on the surface of seed crystal 13 released in the lateral direction and generation of new dislocations during growth of silicon carbide crystal 14 suppressed, as described above. As a result, in any square area 4 obtained by dividing central area 3 to square areas 4 of 1 mm×1 mm, the density of dislocations of which Burgers vector is parallel to the <11-20> direction, with dislocation line existing in the basal plane and the dislocation line exposed at the main surface 1 of semiconductor substrate 10, is at most $1 \times 10^5$ cm$^{-2}$.

Thus, yield of semiconductor devices manufactured by using the above-described semiconductor substrate 10 can be improved.

If the density of dislocations of which Burgers vector is parallel to the <11-20> direction is equal to or lower than $1 \times 10^5$ cm$^{-2}$, yield of semiconductor devices manufactured by using the above-described semiconductor substrate 10 can further be improved.

Further, if the diameter of semiconductor substrate 10 is 4 inches or larger, a large semiconductor substrate is obtained and hence, semiconductor devices can be manufactured efficiently.

Further, if single crystal silicon carbide forming semiconductor substrate 10 has the polytype of 4H, a semiconductor device using a silicon carbide substrate having polytype of 4H has high mobility and, therefore, it can suitably be used for a power device.

Semiconductor substrate 10 in accordance with the present embodiment is fabricated by slicing silicon carbide crystal 14, which was formed with the dislocations on the surface of seed crystal 13 released in the lateral direction and generation of new dislocations during growth of silicon carbide crystal 14 suppressed, as described above. As a result, in any square area 4 obtained by dividing central area 3 to square areas 4 of 1 mm×1 mm, the density of dislocations of which Burgers vector includes components parallel to the <0001> direction and the <11-20> direction is at most $1 \times 10^5$ cm$^{-2}$.

Thus, yield of semiconductor devices manufactured by using the above-described semiconductor substrate 10 can be improved.

If the density of dislocations of which Burgers vector is parallel to the <0001> direction is lower than the density of dislocations of which Burgers vector includes components in the <0001> direction and the <11-20> direction, yield of the semiconductor devices manufactured by using the above-described semiconductor substrate 10 can further be improved.

Further, if the density of dislocations of which Burgers vector is parallel to the <11-20> direction is lower than the density of dislocations of which Burgers vector includes components in the <0001> direction and the <11-20> direction, yield of the semiconductor devices manufactured by using the above-described semiconductor substrate 10 can further be improved.

Further, if the diameter of semiconductor substrate 10 is 4 inches or larger, a large semiconductor substrate is obtained and hence, semiconductor devices can be manufactured efficiently.

Further, if single crystal silicon carbide forming semiconductor substrate 10 has the polytype of 4H, a semiconductor device using a silicon carbide substrate having polytype of 4H has high mobility and, therefore, it can suitably be used for a power device.

Embodiment 2

Figure 7:
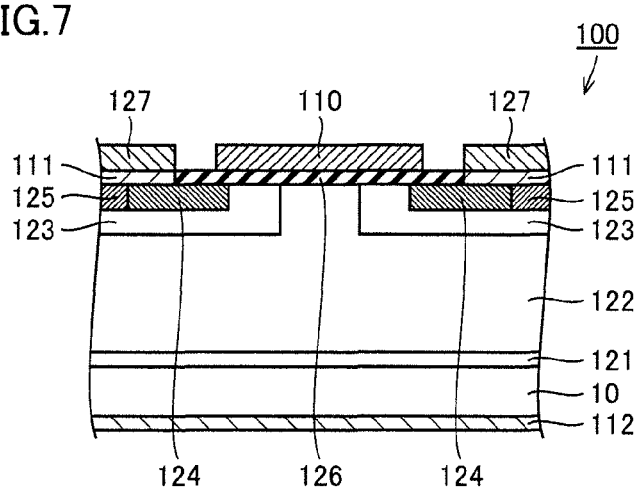
FIG. 7 is a cross-sectional view schematically showing a structure of a semiconductor device in accordance with Embodiment 2 of the present invention.

Referring to FIG. 7, a semiconductor device 100 in accordance with the present embodiment is a vertical DiMOSFET (Double Implanted Metal Oxide Field Effect Transistor), having a semiconductor substrate 10, a buffer layer 121, a breakdown voltage holding layer 122, a p region 123, an n$^+$ region 124, a p$^+$ region 125, an oxide film 126, a source electrode 111, an upper source electrode 127, a gate electrode 110, and a drain electrode 112.

By way of example, in the present embodiment, semiconductor substrate 10 has n type conductivity and, as described in Embodiment 1, the density of dislocations of which Burgers vector is parallel to the <0001> direction may be at most $1\times10^5$ cm$^{-2}$ in any square area 4.

By way of example, in the present embodiment, semiconductor substrate 10 has n type conductivity and, as described in Embodiment 1, the density of dislocations 24 of which Burgers vector is parallel to the <11-20> direction and which have a dislocation line in the basal plane, with the dislocation line exposed to the main surface of the semiconductor substrate may be at most $1\times10^5$ cm$^{-2}$ in any square area 4.

By way of example, in the present embodiment, semiconductor substrate 10 has n type conductivity and, as described in Embodiment 1, the density of dislocations of which Burgers vector includes components parallel to the <0001> direction and the <11-20> direction may be at most $1\times10^5$ cm$^{-2}$ in any square area 4.

Buffer layer 121 has n type conductivity, and its thickness is, for example, 0.5 μm. The concentration of n type conductive impurity in buffer layer 121 is, for example, $5\times10^{17}$ cm$^{-3}$.

Breakdown voltage holding layer 122 is formed on buffer layer 121, and it is formed of silicon carbide having n type conductivity. The thickness of breakdown voltage holding layer 122 is 10 μm, and the concentration of n type conductive impurity is $5\times10^{15}$ cm$^{-3}$.

On an area including a surface of breakdown voltage holding layer 122, a plurality of p regions 123 having p type conductivity are formed spaced apart from each other. In p region 123, an n$^+$ region 124 is formed at a surface layer of p region 123. A p$^+$ region 125 is formed at a position next to n$^+$ region 124. Extending from above n$^+$ region 124 on one p region 123 over breakdown voltage holding layer 122 exposed between two p regions 123, the other p region 123 and above n$^+$ region 124 in the said the other p region 123, oxide film 126 is formed. On oxide film 126, gate electrode 110 is formed. Further, on n$^+$ region 124 and p$^+$ region 125, source electrode 111 is formed. On source electrode 111, an upper source electrode 127 is formed.

In a region within 10 nm from the interface between oxide film 126 and each of the semiconductor layers, that is, n$^+$ region 124, p$^+$ region 125, p region 123, and breakdown voltage holding layer 122, the highest concentration of nitrogen atoms is at least $1\times10^{21}$ cm$^{-3}$. Therefore, mobility particularly at the channel region below oxide film 126 (the portion of p region 123 in contact with oxide film 126 between n$^+$ region 124 and breakdown voltage holding layer 122) can be improved.

Next, the method of manufacturing semiconductor device 100 will be described.

Figure 8:
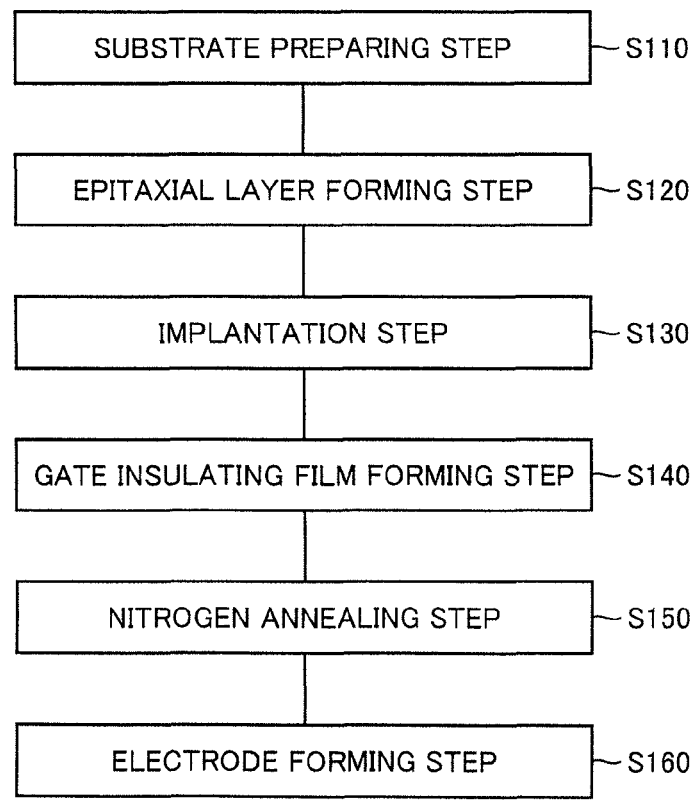
FIG. 8 is a flowchart schematically showing the method of manufacturing the semiconductor device in accordance with Embodiment 2 of the present invention.

First, at a substrate preparing step (step S110: FIG. 8), semiconductor substrate 10 is prepared by the method described in Embodiment 1. Semiconductor substrate 10 has, for example, n type conductivity.

Figure 9:
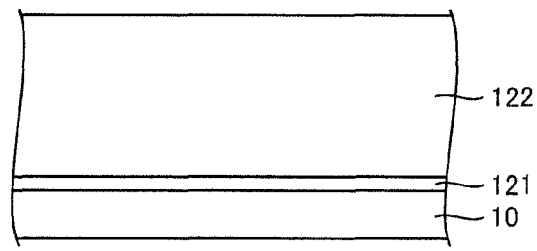
FIG. 9 is a schematic cross sectional view showing a first step of the method of manufacturing the semiconductor device in accordance with Embodiment 2 of the present invention.

Referring to FIG. 9, at the epitaxial layer forming step (step S120: FIG. 8), buffer layer 121 and breakdown voltage holding layer 122 are formed in the following manner.

First, on a surface of semiconductor substrate 10, buffer layer 121 is formed. Buffer layer 121 is formed of silicon carbide of n type conductivity and, by way of example, it is an epitaxial layer of 0.5 μm in thickness. Further, concentration of conductive impurity in buffer layer 121 is, for example, $5\times10^{17}$ cm$^{-3}$.

Next, breakdown voltage holding layer 122 is formed on buffer layer 121. Specifically, a layer formed of silicon carbide having n-type conductivity is formed by epitaxial growth. The thickness of breakdown voltage holding layer 122 is, for example, 10 μm. Concentration of n-type conductive impurity in breakdown voltage holding layer 122 is, for example, $5\times10^{15}$ cm$^{-3}$.

Figure 10:
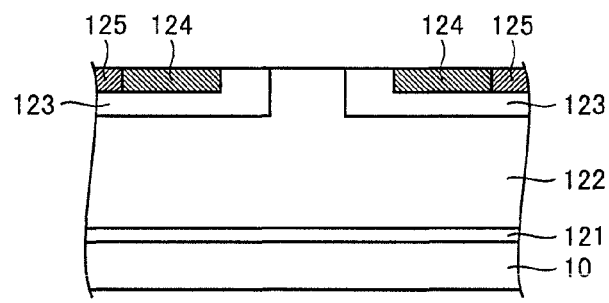
FIG. 10 is a schematic cross sectional view showing a second step of the method of manufacturing the semiconductor device in accordance with Embodiment 2 of the present invention.

Referring to FIG. 10, at the implantation step (step S130: FIG. 8), p region 123, n$^+$ region 124 and p$^+$ region 125 are formed in the following manner.

First, p-type impurity is selectively introduced to a part of breakdown voltage holding layer 122, so that p region 123 is formed. Next, n-type conductive impurity is selectively introduced to a prescribed region to form n$^+$ region 124, and p-type conductive impurity is selectively introduced to a prescribed region to form p$^+$ region 125. Selective introduction of impurities is done using a mask formed, for example, of an oxide film.

Following the implantation step as such, an activation annealing treatment is done. By way of example, annealing is done in an argon atmosphere, at a heating temperature of 1700° C. for 30 minutes.

Figure 11:
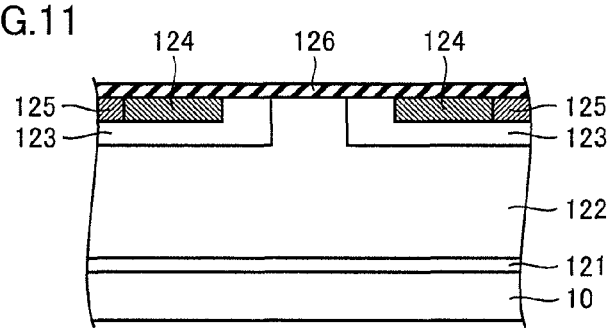
FIG. 11 is a schematic cross sectional view showing a third step of the method of manufacturing the semiconductor device in accordance with Embodiment 2 of the present invention.

Referring to FIG. 11, the gate insulating film forming step (step S140: FIG. 8) is performed. Specifically, oxide film 126 is formed to cover breakdown voltage holding layer 122, p region 123, n$^+$ region 124 and p$^+$ region 125. The film may be formed by dry oxidation (thermal oxidation). Conditions for dry oxidation are, for example, heating temperature of 1200° C. and heating time of 30 minutes.

Thereafter, the nitrogen annealing step (step S150: FIG. 8) is done. Specifically, annealing is done in a nitrogen monoxide (NO) atmosphere. Conditions for this process are, for example, heating temperature of 1100° C. and heating time of 120 minutes. As a result, nitrogen atoms are introduced to the vicinity of interface between each of breakdown voltage holding layer 122, p region 123, n$^+$ region 124 and p$^+$ region 125 and oxide film 126.

Following the annealing step using nitrogen monoxide, annealing using argon (Ar) gas as an inert gas may be performed. Conditions for the process are, for example, heating temperature of 1100° C. and heating time of 60 minutes.

Figure 12:
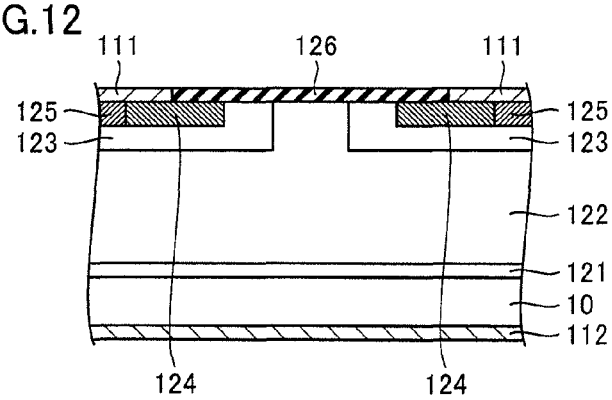
FIG. 12 is a schematic cross sectional view showing a fourth step of the method of manufacturing the semiconductor device in accordance with Embodiment 2 of the present invention.

Referring to FIG. 12, by the electrode forming step (step S160: FIG. 8), source electrode 111 and drain electrode 112 are formed in the following manner.

First, on oxide film 126, using photolithography, a resist film having a pattern is formed. Using the resist film as a mask, portions of oxide film 126 positioned on n⁺ region 124 and p⁺ region 125 are removed by etching. Thus, openings are formed in oxide film 126. Next, a conductive film is formed to be in contact with each of n⁺ region 124 and p⁺ region 125 in the openings. Then, the resist film is removed, whereby portions of the conductive film that have been positioned on the resist film are removed (lift off). The conductive film may be a metal film and, by way of example, it is formed of nickel (Ni). As a result of this lift off, source electrode 111 is formed.

Here, heat treatment for alloying is preferably carried out. By way of example, heat treatment is done in an atmosphere of argon (Ar) gas as an inert gas, at a heating temperature of 950° C. for 2 minutes.

Again referring to FIG. 7, on source electrode 111, upper source electrode 127 is formed. Further, on the backside surface of semiconductor substrate 10, drain electrode 112 is formed. In this manner semiconductor device 100 is obtained.

As described above, the silicon carbide semiconductor of the present invention such as the substrate in accordance with Embodiment 1 is used for semiconductor device 100 of the present embodiment. As a result, yield of semiconductor devices 100 can be improved.

It is noted that a structure having conductivity types reversed from the present embodiment, that is, p-type and n-type reversed, may be used. Further, though a DiMOSFET has been described as an example of semiconductor device 100 in the present embodiment, semiconductor device 100 may, for example, be a trench type MOSFET. Further, the manufacturing method described above may be used for fabricating various semiconductor devices such as IGBT (Insulated Gate Bipolar Transistor) and diode, other than MOSFET.

Next, examples will be described.

In the present embodiment, using semiconductor substrates 10 having comparable average dislocation densities but different local dislocation densities, vertical DiMOSFETs are fabricated, and drain leak current density was measured, to find the yield of MOSFET devices.

Examples 1 to 20

Semiconductor substrates 10 used for MOSFET devices of Examples 1 to 20 were manufactured in accordance with the method described in Embodiment 1. Specifically, as seed crystal 13, silicon carbide having the polytype of 4H was used. Then, silicon carbide crystal was grown by sublimation (high frequency heating) on the surface of seed crystal 13 under the conditions of growth temperature of 2300° C. and growth pressure of about 4 kPa (30 Torr). Crucible 11 used in the apparatus for sublimation of silicon carbide crystal was formed of graphite. Crucible 11 had outer diameter of φ140 cm, inner diameter of φ120 cm, and height of 100 cm. As to the size of seed crystal 13, it had the diameter of 6 inches. The off angle with respect to the (0001) plane of seed crystal 13 was 4°. Further, the surface of seed crystal 13 was subjected to CMP process, so that the surface roughness of seed crystal 13 was made smaller than 1 nm in root-mean square (RMS) roughness. As the source material 12, silicon carbide powder was used. The growth rate of silicon carbide crystal 14 was made smaller than 0.01 mm per hour.

By measuring the dislocation density of semiconductor substrates 10 manufactured in accordance with the above-described method, substrates used for Examples 1 to 5 were obtained. In semiconductor substrates 10 used for the devices of Examples 1 to 5, in any square area 4 of 1 mm×1 mm, the density of dislocations of which Burgers vector is parallel to the <0001> direction is at most 1×10⁵ cm⁻².

By measuring the dislocation density of semiconductor substrates 10 manufactured in accordance with the above-described method, semiconductor substrates 10 were classified to those to be used for Examples 6 to 10 and those to be used for Examples 11 to 15. In semiconductor substrates 10 used for the devices of Examples 6 to 10, in any square area 4 of 1 mm×1 mm, density of dislocations of which Burgers vector is parallel to the <11-20> direction and which have dislocation line in the basal plane, with the dislocation line exposed to the main surface 1 of semiconductor substrate 10 (hereinafter referred to as basal plane dislocations in the <11-20> direction) is at most 1×10⁵ cm⁻². In semiconductor substrates 10 used for the devices of Examples 11 to 15, in any square area 4 of 1 mm×1 mm, density of dislocations of which Burgers vector is parallel to the <11-20> direction is at most 1×10⁵ cm⁻². In other words, in semiconductor substrates 10 used for the devices of Examples 11 to 15, in any square area 4 of 1 mm×1 mm, total density of dislocations including the basal plane dislocations in the <11-20> direction mentioned above and other dislocations of which Burgers vector is parallel to the <11-20> direction is at most 1×10⁵ cm⁻².

By measuring the dislocation density of semiconductor substrates 10 manufactured in accordance with the above-described method, substrates used for Examples 16 to 20 were obtained. In semiconductor substrates 10 used for the devices of Examples 16 to 20, in any square area 4 of 1 mm×1 mm, the density of dislocations of which Burgers vector includes components parallel to the <0001> direction and the <11-20> direction is at most 1×10⁵ cm⁻².

Using the above-described semiconductor substrates 10, vertical DiMOSFET devices of Examples 1 to 20 were fabricated in accordance with the method of Embodiment 2.

Comparative Examples 1 to 4

Semiconductor substrates 10 used for Comparative Examples 1 to 4 were fabricated in the similar manner as Examples 1 to 20, mainly except for the following point. Specifically, semiconductor substrates 10 used for Comparative Examples were fabricated under the condition that the off angle of seed substrate was 12°. On the other hand, semiconductor substrates 10 for Examples 1 to 20 were fabricated under the condition that the off angle of seed substrate was 4°.

Using semiconductor substrates 10 as described above, vertical DiMOSFET devices of Comparative Examples were fabricated, in accordance with the method described in Embodiment 2.

(Method of Measuring Yield)

The yield of vertical DiMOSFETs of Examples 1 to 20 and Comparative Examples 1 to 4 was measured in the following manner. Drain leak current density ($I_D$) of vertical DiMOSFET devices was measured under the conditions of drain voltage ($V_D$)=1100V and gate voltage ($V_G$=0V). Devices of which drain leak current density was 1 μA/mm² or higher were determined to be defective, while devices of which drain leak current density was lower than 1 μA/mm² were determined to be good. The yield represents the ratio of good devices to all the measured devices.

(Results)

TABLE 1

| Unit | Items | | |
|---|---|---|---|
| | Average dislocation density $cm^{-2}$ | Local dislocation density $cm^{-2}$ | Yield % |
| Comparative Example 1 | $3 \times 10^4$ | Higher than $1 \times 10^6$ | 51 |
| Example 1 | $3 \times 10^4$ | Lower than $1 \times 10^5$ | 79 |
| Example 2 | $3 \times 10^4$ | Lower than $5 \times 10^4$ | 85 |
| Example 3 | $3 \times 10^4$ | Lower than $3 \times 10^4$ | 91 |
| Example 4 | $8 \times 10^3$ | Lower than $1 \times 10^4$ | 93 |
| Example 5 | $1 \times 10^3$ | Lower than $1 \times 10^4$ | 95 |

Table 1 represents the relation between the yield of vertical DiMOSFET devices manufactured using semiconductor substrates 10 as substrates in which in any square area 4 of 1 mm×1 mm, the density of dislocations of which Burgers vector is parallel to the <0001> direction is at most $1 \times 10^5$ $cm^{-2}$, and average dislocation density and local dislocation density of semiconductor substrates 10. Here, the local dislocation density refers to the dislocation density of an area having the highest dislocation density among the square areas 4 in central area 3 of semiconductor substrate 10.

As shown in Table 1, the yield of devices (Comparative Example 1) of which local dislocation density was higher than about $1 \times 10^6$ $cm^{-2}$ was as low as 51%. On the other hand, the yield of devices (Example 1) of which local dislocation density was lower than about $1 \times 10^5$ $cm^{-2}$ was 79%, which was higher than the yield of Comparative Example. Further, the local dislocation density and the device yield had relatively strong correlation, and when the local dislocation density became lower, the device yield was improved. Further, it can be seen from the comparison between Comparative Example 1 and Example 3 that though average dislocation density was about $3 \times 10^4$ $cm^{-2}$ and substantially the same, the yield was much different. Specifically, the experiment made it clear that in order to improve the yield of devices, it is effective to reduce local dislocation density, rather than focusing only on the average dislocation density of semiconductor substrate 10.

TABLE 2

| Unit | Items | | |
|---|---|---|---|
| | Average dislocation density $cm^{-2}$ | Local dislocation density $cm^{-2}$ | Yield % |
| Comparative Example 2 | $3 \times 10^4$ | Higher than $1 \times 10^6$ | 45 |
| Example 6 | $3 \times 10^4$ | Lower than $1 \times 10^5$ | 75 |
| Example 7 | $3 \times 10^4$ | Lower than $5 \times 10^4$ | 79 |
| Example 8 | $3 \times 10^4$ | Lower than $3 \times 10^4$ | 85 |
| Example 9 | $8 \times 10^3$ | Lower than $1 \times 10^4$ | 90 |
| Example 10 | $1 \times 10^3$ | Lower than $1 \times 10^4$ | 95 |

Table 2 represents the relation between the yield of vertical DiMOSFET devices manufactured using semiconductor substrates 10 as substrates in which in any square area 4 of 1 mm×1 mm, density of dislocations of which Burgers vector is parallel to the <11-20> direction and which have dislocation line in the basal plane, with the dislocation line exposed to the main surface 1 of semiconductor substrate 10 is at most $1 \times 10^5$ $cm^{-2}$, and average dislocation density and local dislocation density of semiconductor substrates 10. Here, the local dislocation density refers to the dislocation density of an area having the highest dislocation density among the square areas 4 in central area 3 of semiconductor substrate 10.

As shown in Table 2, the yield of devices (Comparative Example 2) of which local dislocation density was higher than about $1 \times 10^6$ $cm^{-2}$ was as low as 45%. On the other hand, the yield of devices (Example 6) of which local dislocation density was lower than about $1 \times 10^5$ $cm^{-2}$ was 75%, which was higher than the yield of Comparative Example 2. Further, the local dislocation density and the device yield had relatively strong correlation, and when the local dislocation density became lower, the device yield was improved. Further, it can be seen from the comparison between Comparative Example 2 and Example 8 that though average dislocation density was about $3 \times 10^4$ $cm^{-2}$ and substantially the same, the yield was much different. Specifically, the experiment made it clear that in order to improve the yield of devices, it is effective to reduce local dislocation density, rather than focusing only on the average dislocation density of semiconductor substrate 10.

TABLE 3

| Unit | Items | | |
|---|---|---|---|
| | Average dislocation density $cm^{-2}$ | Local dislocation density $cm^{-2}$ | Yield % |
| Comparative Example 3 | $3 \times 10^4$ | Higher than $1 \times 10^6$ | 51 |
| Example 11 | $3 \times 10^4$ | Lower than $1 \times 10^5$ | 75 |
| Example 12 | $3 \times 10^4$ | Lower than $5 \times 10^4$ | 82 |
| Example 13 | $3 \times 10^4$ | Lower than $3 \times 10^4$ | 90 |
| Example 14 | $8 \times 10^3$ | Lower than $1 \times 10^4$ | 93 |
| Example 15 | $1 \times 10^3$ | Lower than $1 \times 10^4$ | 95 |

Table 3 represents the relation between the yield of vertical DiMOSFET devices manufactured using semiconductor substrates 10 as substrates in which in any square area 4 of 1 mm×1 mm, density of dislocations of which Burgers vector is parallel to the <11-20> direction is at most $1 \times 10^5$ $cm^{-2}$, and average dislocation density and local dislocation density of semiconductor substrates 10.

As shown in Table 3, the yield of devices (Comparative Example 3) of which local dislocation density was higher than about $1 \times 10^6$ $cm^{-2}$ was as low as 51%. On the other hand, the yield of devices (Example 11) of which local dislocation density was lower than about $1 \times 10^5$ $cm^{-2}$ was 75%, which was higher than the yield of Comparative Example 3. Further, the local dislocation density and the device yield had relatively strong correlation, and when the local dislocation density became lower, the device yield was improved. Further, it can be seen from the comparison between Comparative Example 3 and Example 13 that though average dislocation density was about $3 \times 10^4$ $cm^{-2}$ and substantially the same, the yield was much different. Specifically, the experiment also made it clear that in order to improve the yield of devices, it is effective to reduce local dislocation density, rather than focusing only on the average dislocation density of semiconductor substrate 10.

Further, it can be seen from the comparison between Examples 8 and 13 of the present invention that though these examples both have comparable average dislocation density and local dislocation density, Example 13 has higher yield than Example 8. Namely, it is shown that the yield of devices (Example 13) of which density of dislocations including the basal plane dislocations in the <11-20> direction and other dislocations of which Burgers vector is parallel to the <11-

20> direction is at most $1 \times 10^5$ cm$^{-2}$ in any square area 4 of 1 mm×1 mm can be better improved than the yield of devices (Example 8) of which density of dislocations of which Burgers vector is parallel to the <11-20> direction is at most $1 \times 10^5$ cm$^{-2}$ in any square area 4 of 1 mm×1 mm.

From the foregoing, it can be seen that when semiconductor substrate 10 in which density of basal plane dislocations in the <11-20> direction is at most $1 \times 10^5$ cm$^{-2}$ in any square area 4 of 1 mm×1 mm is used, the yield of semiconductor devices 100 using the semiconductor substrate 10 can be improved. Further, it can be seen that when semiconductor substrate 10 in which density of dislocations including the basal plane dislocations in the <11-20> direction and other dislocations of which Burgers vector is parallel to the <11-20> direction is at most $1 \times 10^5$ cm$^{-2}$ in any square area 4 of 1 mm×1 mm is used, the yield of semiconductor devices 100 using the semiconductor substrate 10 can be improved.

TABLE 4

| | Items | | |
|---|---|---|---|
| Unit | Average dislocation density cm$^{-2}$ | Local dislocation density cm$^{-2}$ | Yield % |
| Comparative Example 4 | $3 \times 10^4$ | Higher than $1 \times 10^6$ | 51 |
| Example 16 | $3 \times 10^4$ | Lower than $1 \times 10^5$ | 75 |
| Example 17 | $3 \times 10^4$ | Lower than $5 \times 10^4$ | 82 |
| Example 18 | $3 \times 10^4$ | Lower than $3 \times 10^4$ | 90 |
| Example 19 | $8 \times 10^3$ | Lower than $1 \times 10^4$ | 93 |
| Example 20 | $1 \times 10^3$ | Lower than $1 \times 10^4$ | 95 |

Table 4 represents the relation between the yield of vertical DiMOSFET devices manufactured using semiconductor substrates 10 as substrates in which in any square area 4 of 1 mm×1 mm, the density of dislocations of which Burgers vector includes components parallel to the <0001> direction and the <11-20> direction is at most $1 \times 10^5$ cm$^{-2}$, and average dislocation density and local dislocation density of semiconductor substrates 10. Here, the local dislocation density refers to the dislocation density of an area having the highest dislocation density among the square areas 4 in central area 3 of semiconductor substrate 10.

As shown in Table 4, the yield of devices (Comparative Example 4) of which local dislocation density was higher than about $1 \times 10^6$ cm$^{-2}$ was as low as 51%. On the other hand, the yield of devices (Example 16) of which local dislocation density was lower than about $1 \times 10^5$ cm$^{-2}$ was 75%, which was higher than the yield of Comparative Example 4. Further, the local dislocation density and the device yield had relatively strong correlation, and when the local dislocation density became lower, the device yield was improved. Further, it can be seen from the comparison between Comparative Example 4 and Example 18 that though average dislocation density was about $3 \times 10^4$ cm$^{-2}$ and substantially the same, the yield was much different. Specifically, the experiment made it clear that in order to improve the yield of devices, it is effective to reduce local dislocation density, rather than focusing only on the average dislocation density of semiconductor substrate 10.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor substrate having a main surface, formed of single crystal silicon carbide, said main surface comprising:
   an outer circumferential area within 5 mm from an outer circumference; and
   a central area as an area other than the outer circumferential area, wherein
   when said central area is divided into square areas of 1 mm×1 mm, in any said square area, density of dislocations of which Burgers vector is parallel to <0001> direction is at most $1 \times 10^5$ cm$^{-2}$,
   wherein
   in said central area, density of dislocations of which Burgers vector is parallel to the <0001> direction is lower than density of dislocations of which Burgers vector includes components in the <0001> direction and <11-20> direction.

2. The semiconductor substrate according to claim 1, including
   a dislocation branched to a plurality of dislocation lines inside said semiconductor substrate and of which Burgers vector is parallel to the <0001> direction.

3. The semiconductor substrate according to claim 1, of which diameter is at least 4 inches.

4. The semiconductor substrate according to claim 1, wherein the single crystal silicon carbide forming said semiconductor substrate has polytype of 4H.

5. A semiconductor substrate having a main surface, formed of single crystal silicon carbide, said main surface comprising:
   an outer circumferential area within 5 mm from an outer circumference; and
   a central area as an area other than the outer circumferential area, wherein
   when said central area is divided into square areas of 1 mm×1 mm, in any said square area, density of dislocations of which Burgers vector is parallel to <11-20> direction, with dislocation line existing in a basal plane and the dislocation line exposed at the main surface of the semiconductor substrate, is at most $1 \times 10^5$ cm$^{-2}$,
   wherein
   in said central area, density of dislocations of which Burgers vector is parallel to the <11-20> direction is lower than density of dislocations of which Burgers vector includes components in the <0001> direction and the <11-20> direction.

6. The semiconductor substrate according to claim 5, including a dislocation branched to a plurality of dislocation lines inside said semiconductor substrate and having Burgers vector parallel to the <11-20> direction.

7. The semiconductor substrate according to claim 5, of which diameter is at least 4 inches.

8. The semiconductor substrate according to claim 5, wherein the single crystal silicon carbide forming said semiconductor substrate has polytype of 4H.

9. A semiconductor substrate having a main surface, formed of single crystal silicon carbide, said main surface comprising:
   an outer circumferential area within 5 mm from an outer circumference; and
   a central area as an area other than the outer circumferential area, wherein
   when said central area is divided into square areas of 1 mm×1 mm, in any said square area, density of dislocations of which Burgers vector includes components parallel to <0001> direction and <11-20> direction is at most $1\times10^5$ cm$^{-2}$.

10. The semiconductor substrate according to claim 9, wherein
in said central area, density of dislocations of which Burgers vector is parallel to the <0001> direction is lower than density of dislocations of which Burgers vector includes components in the <0001> direction and the <11-20> direction.

11. The semiconductor substrate according to claim 9, wherein
in said central area, density of dislocations of which Burgers vector is parallel to the <11-20> direction is lower than density of dislocations of which Burgers vector includes components in the <0001> direction and the <11-20> direction.

12. The semiconductor substrate according to claim 9, including a dislocation branched to a plurality of dislocation lines inside said semiconductor substrate and having Burgers vector including components in the <0001> direction and the <11-20> direction.

13. The semiconductor substrate according to claim 9, of which diameter is at least 4 inches.

14. The semiconductor substrate according to claim 9, wherein
the single crystal silicon carbide forming said semiconductor substrate has polytype of 4H.

* * * * *